(12) United States Patent
Yoshimatsu et al.

(10) Patent No.: US 9,691,730 B2
(45) Date of Patent: Jun. 27, 2017

(54) SEMICONDUCTOR DEVICE AND METHOD FOR MANUFACTURING THE SAME

(71) Applicant: Mitsubishi Electric Corporation, Tokyo (JP)

(72) Inventors: Naoki Yoshimatsu, Tokyo (JP); Yusuke Ishiyama, Tokyo (JP); Taketoshi Shikano, Tokyo (JP); Yuji Imoto, Tokyo (JP); Junji Fujino, Tokyo (JP); Shinsuke Asada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/754,141

(22) Filed: Jun. 29, 2015

(65) Prior Publication Data

US 2016/0099224 A1 Apr. 7, 2016

(30) Foreign Application Priority Data

Oct. 2, 2014 (JP) ................................ 2014-203624

(51) Int. Cl.
*H01L 29/40* (2006.01)
*H01L 23/00* (2006.01)
*H01L 23/057* (2006.01)
*H01L 25/07* (2006.01)

(52) U.S. Cl.
CPC ............. *H01L 24/48* (2013.01); *H01L 24/83* (2013.01); *H01L 24/84* (2013.01); *H01L 24/85* (2013.01); *H01L 23/057* (2013.01); *H01L 24/45* (2013.01); *H01L 25/072* (2013.01); *H01L 2224/40137* (2013.01); *H01L 2224/45124* (2013.01); *H01L 2224/48472* (2013.01); *H01L 2224/73221* (2013.01); *H01L 2924/13055* (2013.01)

(58) Field of Classification Search
CPC ............. H01L 29/0696; H01L 29/1095; H01L 29/7393
USPC .......................................................... 257/784
See application file for complete search history.

(56) References Cited

U.S. PATENT DOCUMENTS

2014/0048918 A1* 2/2014 Nagaune ............. H01L 23/4334
257/675
2014/0284786 A1* 9/2014 Fukuyoshi .............. H01L 24/36
257/712
2014/0346676 A1* 11/2014 Horio ...................... H01L 25/18
257/773

FOREIGN PATENT DOCUMENTS

JP 2013-062405 A 4/2013

* cited by examiner

*Primary Examiner* — Elias M Ullah
(74) *Attorney, Agent, or Firm* — Studebaker & Brackett PC

(57) ABSTRACT

A semiconductor device according to the present invention includes an insulating substrate having a circuit pattern, semiconductor elements bonded on the circuit pattern with a brazing material, and a wiring terminal bonded with a brazing material on an electrode provided on each of the semiconductor elements on an opposite side of the circuit pattern, in which a part of the wiring terminal is in contact with the insulating substrate, and insulated from the circuit pattern.

4 Claims, 4 Drawing Sheets

SEMICONDUCTOR DEVICE AND METHOD FOR MANUFACTURING THE SAME

BACKGROUND OF THE INVENTION

Field of the Invention

The present invention relates to a semiconductor device and a method for manufacturing the same, and more particularly to a power semiconductor device to be used in an inverter circuit for controlling a motor in an electric car or a train, a regenerative converter circuit, or in a booster circuit and a method for manufacturing the same.

Description of the Background Art

According to a conventional power semiconductor device, a wiring terminal to be bonded to an electrode provided on an upper surface of a semiconductor element is fixed to a resin case by integral molding (refer to Japanese Patent Application Laid-Open No. 2013-62405). Therefore, to improve precision in distance between the semiconductor element and the wiring terminal is important in assembling (manufacturing) the semiconductor device.

According to the above semiconductor device, warpage or waviness is generated in a bonded surface between the resin case and a substrate on which the resin case is arranged, due to shrinkage of a resin of the resin case. Furthermore, warpage is generated in the substrate because materials having different thermal expansion rates are bonded in a step of manufacturing the semiconductor device. Still furthermore, a bonding agent for bonding the resin case to the substrate varies in thickness.

As measures for the above problems, conventionally, a dimension of the resin case has been strictly controlled, and precision in assembling the semiconductor device has been controlled and inspected, to bond the semiconductor element to the wiring terminal within a desired distance range.

In a case where a distance is small between the semiconductor element and the wiring terminal in the conventional semiconductor device, a thermal stress applied to the semiconductor element is increased due to a thermal cycle, so that the problem is that reliability of the semiconductor device is reduced. Meanwhile, in a case where the distance is large between the semiconductor element and the wiring terminal, a brazing material such as a solder supplied to bond the semiconductor element to the wiring terminal becomes insufficient, which causes defective bonding.

SUMMARY OF THE INVENTION

It is an object of the present invention to provide a semiconductor device capable of easily bonding a semiconductor element to a wiring terminal within a desirable distance range without the need to strictly control a dimension of a resin case and control precision in assembling the semiconductor device, and a method for manufacturing the same.

A semiconductor device according to an aspect of the present invention includes an insulating substrate having a first circuit pattern, a semiconductor element bonded on the first circuit pattern with a first brazing material, and a wiring terminal bonded with a second brazing material on an electrode provided on the semiconductor element on an opposite side of the first circuit pattern, in which a part of the wiring terminal is in contact with the insulating substrate, and insulated from the first circuit pattern.

According to the aspect of the present invention, the semiconductor device includes the insulating substrate having the first circuit pattern, the semiconductor element bonded on the first circuit pattern with the first brazing material, and the wiring terminal bonded with the second brazing material on the electrode provided on the semiconductor element on the opposite side of the first circuit pattern, in which the part of the wiring terminal is in contact with the insulating substrate, and insulated from the first circuit pattern, so that the semiconductor element can be easily bonded to the wiring terminal within the desired distance range without the need to strictly control the dimension of the resin case and control the precision in assembling the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENT

Hereinafter, a preferred embodiment of the present invention will be described with reference to the drawings.

<Premise Technique>

First, a description will be given to a technique serving as a premise (premise technique) of the present invention.

Figure 6:
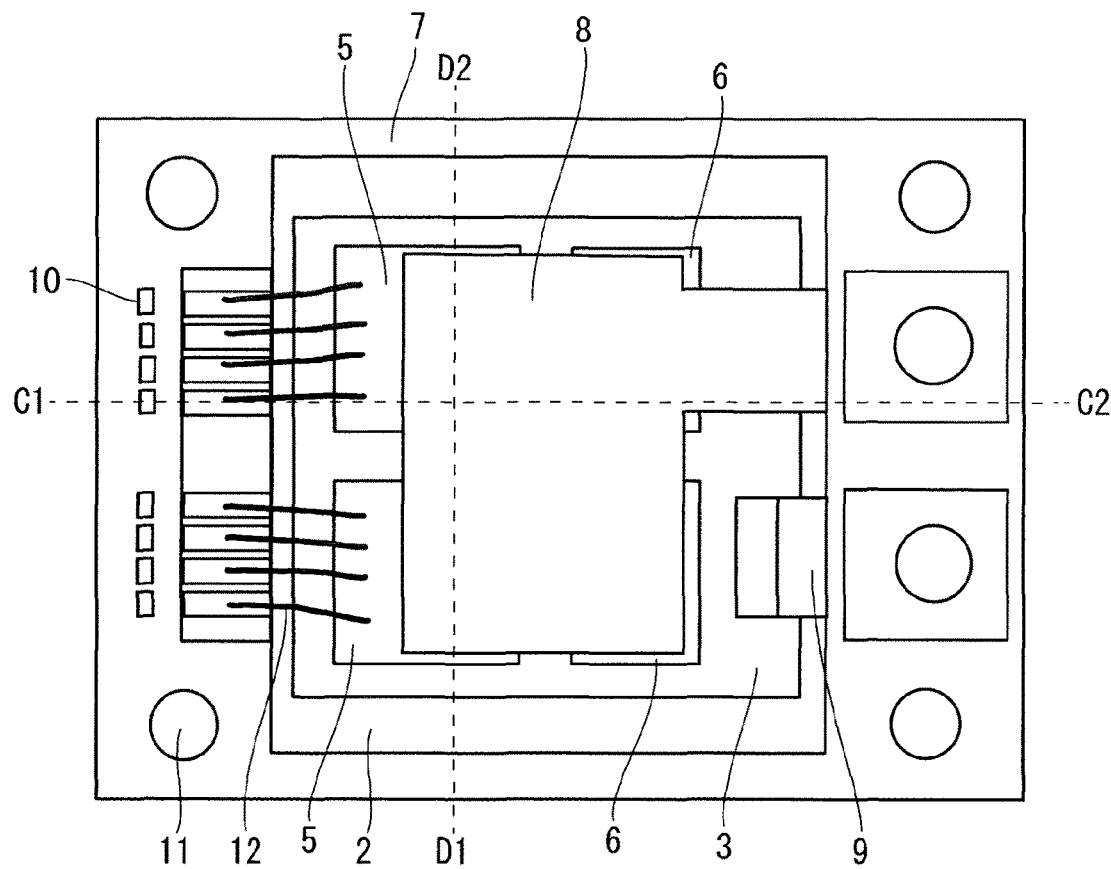
FIG. 6 is a plan view illustrating one example of a configuration of a semiconductor device according to a premise technique.
Figure 7:
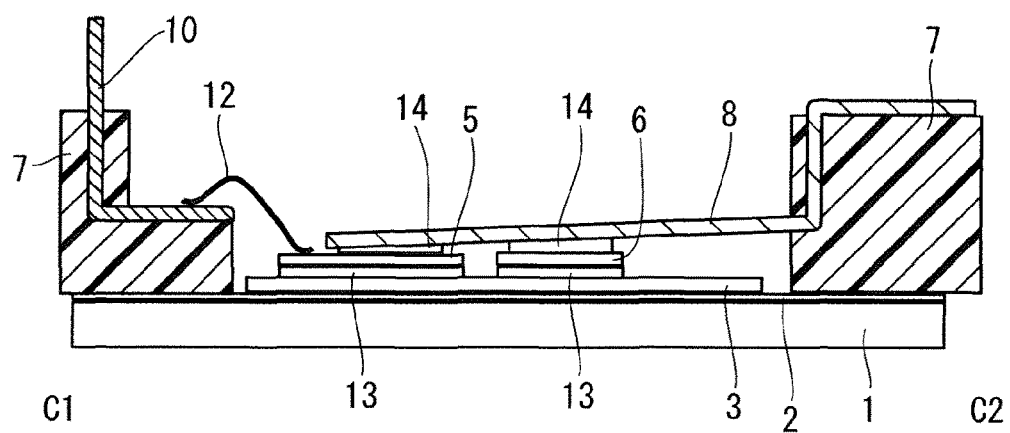
FIG. 7 is a view illustrating one example of a cross-sectional surface taken along a line C1-C2 in FIG. 6.
Figure 8:
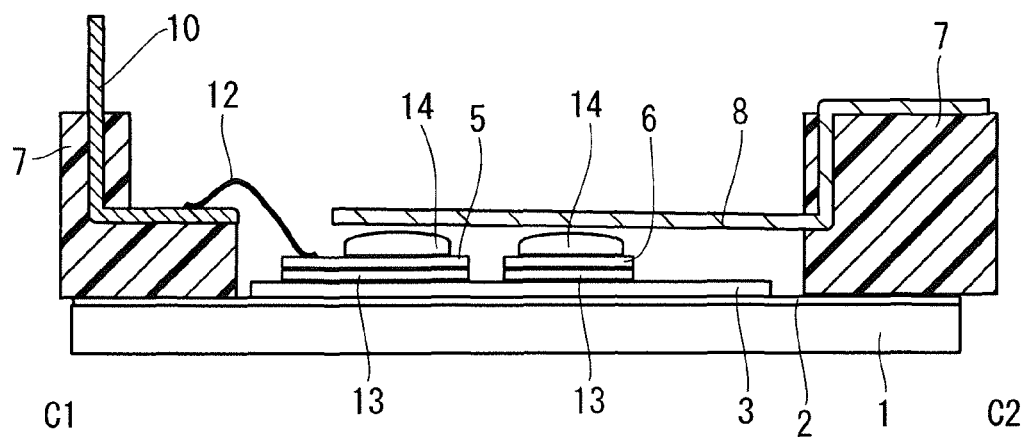
FIG. 8 is a view illustrating another example of a cross-sectional surface taken along the line C1-C2 in FIG. 6.
Figure 9:
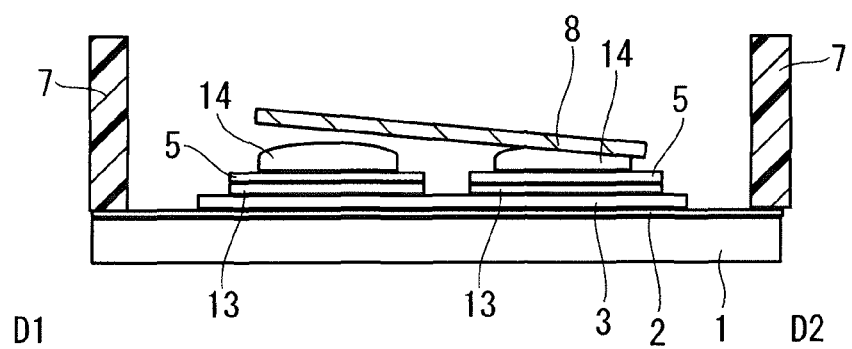
FIG. 9 is a view illustrating one example of a cross-sectional surface taken along a line D1-D2 in FIG. 6.

FIG. 6 is a plan view illustrating one example of a configuration of a power semiconductor device according to the premise technique. FIGS. 7 and 8 are cross-sectional views each illustrating one example of a cross-sectional surface taken along a line C1-C2 in FIG. 6. FIG. 9 is a view illustrating one example of a cross-sectional surface taken along a line D1-D2 in FIG. 6.

As illustrated in FIGS. 6 to 9, according to the semiconductor device in the premise technique, an insulating layer 2 is formed on an insulating substrate 1, and a circuit pattern 3 is formed on the insulating layer 2. A semiconductor element 5 and a semiconductor element 6 are bonded on the circuit pattern 3 through a brazing material 13. Here, the insulating substrate 1 includes a metal base substrate. In addition, the semiconductor element 5 includes an insulated gate bipolar transistor (IGBT), and the semiconductor element 6 includes a free wheeling diode (FWD).

A resin case 7 is arranged so as to be bonded to the insulating layer 2 in a peripheral portion of the insulating substrate 1. A wiring terminal 8, a wiring terminal 9, a signal terminal 10, and a mounting collar 11 are integrated with the resin case 7. Here, the wiring terminal 8 includes an emitter (E) terminal, and the wiring terminal 9 includes a collector (C) terminal.

As illustrated in FIG. 7, in a case where a distance is small between the semiconductor elements 5 and 6, and the wiring terminal 8, a thermal stress to the semiconductor elements 5 and 6 due to a thermal cycle is increased, and the problem is that reliability of the semiconductor device is reduced. Furthermore, a brazing material 14 problematically protrudes at the time of bonding the semiconductor elements 5 and 6 to the wiring terminal 8.

Meanwhile, as illustrated in FIG. 8, in a case where a distance is large between the semiconductor elements 5 and 6, and the wiring terminal 8, the brazing material 14 becomes insufficient, and the problem is that the semiconductor elements 5 and 6 cannot be bonded to the wiring terminal 8.

Furthermore, as illustrated in FIG. 9, in a case where a distance is not uniform between the semiconductor element 5 and the wiring terminal 8, the distance between the semiconductor element 5 and the wiring terminal 8 varies in length from small to large, which causes the similar problems in FIGS. 7 and 8.

As described above, it is important to keep the distance constant between the semiconductor elements 5 and 6, and the wiring terminal 8.

The present invention was made to solve the above problems, and will be described in detail below.

<Preferred Embodiment>

Figure 1:
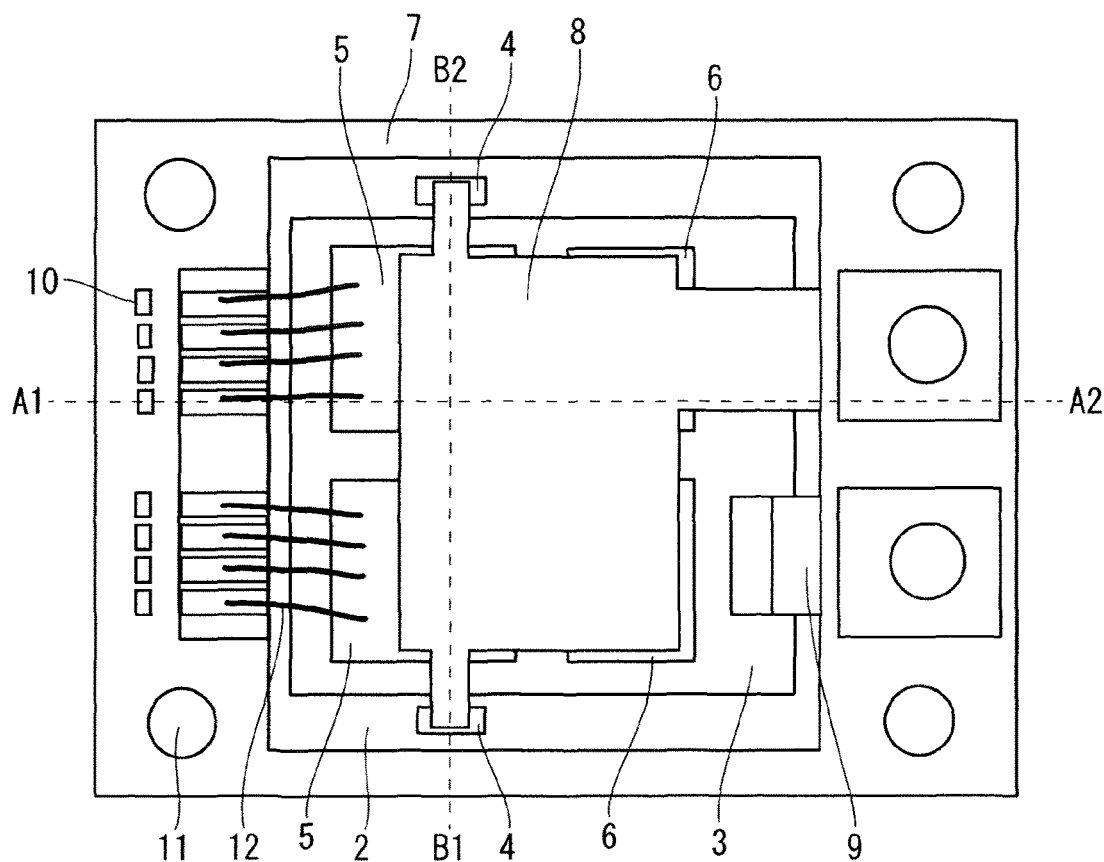
FIG. 1 is a plan view illustrating one example of a configuration of a semiconductor device according to a preferred embodiment of the present invention.
Figure 2:
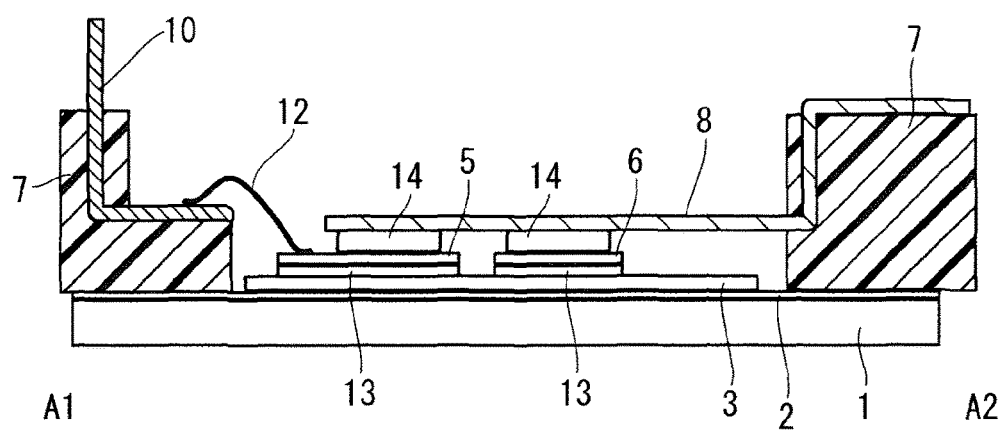
FIG. 2 is a cross-sectional view taken along a line A1-A2 in FIG. 1.
Figure 3:
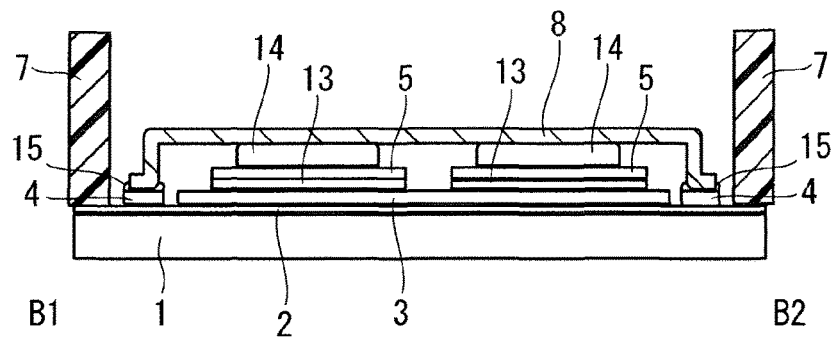
FIG. 3 is a cross-sectional view taken along a line B1-B2 in FIG. 1.

FIG. 1 is a plan view illustrating one example of a configuration of a power semiconductor device according to the preferred embodiment of the present invention. FIG. 2 is a cross-sectional view taken along a line A1-A2 in FIG. 1. FIG. 3 is a cross-sectional view taken along a line B1-B2 in FIG. 1.

As illustrated in FIGS. 1 and 3, the semiconductor device according to this preferred embodiment is characterized in that the wiring terminal 8 is partially bonded to a circuit pattern 4 (second circuit pattern) through a brazing material 15 (third brazing material). A configuration other than that is similar to that of the semiconductor device in the premise technique, so that a detailed description for it is omitted here.

As illustrated in FIGS. 1 to 3, the wiring terminal 8 is bonded with the brazing material 14 (second brazing material) on an electrode formed on an upper surface of each of the semiconductor element 5 and the semiconductor element 6 (this electrode is provided on each of the semiconductor elements 5 and 6 on an opposite side of the circuit pattern 3 (first circuit pattern)). The semiconductor elements 5 and 6 are bonded on the circuit pattern 3 with the brazing material 13 (first brazing material). Furthermore, the wiring terminal 8 is formed so as to partially protrude (at two sections).

The protruding sections of the wiring terminal 8 extend toward the insulating substrate 1, and each of them is bonded on the circuit pattern 4 with the brazing material 15. That is, the wiring terminal 8 is partially in contact with the insulating substrate 1 through the circuit pattern 4, and is in contact with the insulating substrate 1 at several positions on opposite sides of the semiconductor elements 5 and 6 in a planar view. Furthermore, the circuit pattern 4 is provided on the insulating layer 2, and separated (insulated) from the circuit pattern 3. If a fine space is generated between the wiring terminal 8 and the circuit pattern 4 due to a variation in assembly of the semiconductor device, discharge is generated in the space while a switching operation is performed in the semiconductor element 5, which causes a noise to be generated and reduces reliability of the insulating layer 2, but this can be prevented by bonding the wiring terminal 8 to the circuit pattern 4 through the brazing material 15.

The wiring terminal 9 is bonded to the circuit pattern 3 through a brazing material (not illustrated). The signal terminal 10 is bonded to the semiconductor element 5 through an aluminum wire 12.

Figure 4:
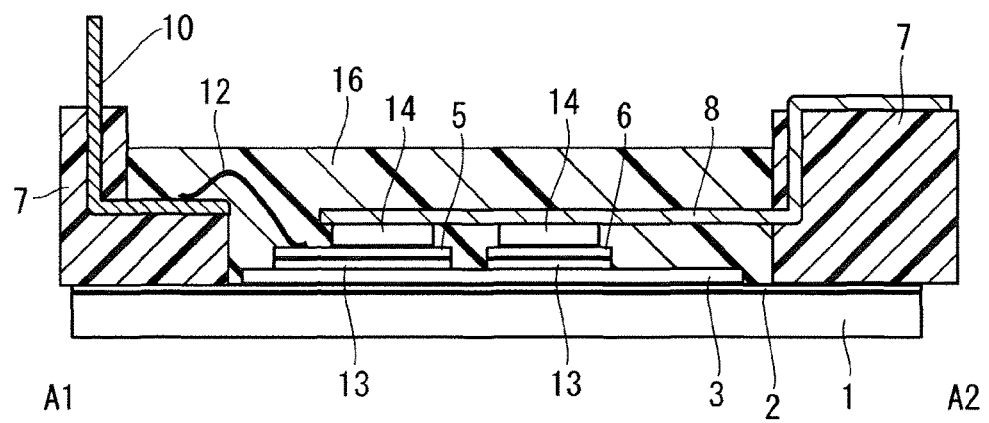
FIG. 4 is a cross-sectional view illustrating a state in which the device in FIG. 2 is sealed with a resin.

In a step of assembling the semiconductor device (manufacturing step) illustrated in FIGS. 1 to 3, when the wiring terminal 8 is bonded to the electrode formed on the upper surface of each of the semiconductor elements 5 and 6 through the brazing material 14, the wiring terminal 8 is pressed from above toward the insulating substrate 1. At this time, the wiring terminal 8 partially abuts on and is bonded to the circuit pattern 4, so that the insulating layer 2 can be prevented from being damaged by the pressure to the wiring terminal 8. As a result, quality and reliability can be improved in the semiconductor device. After that, as illustrated in FIG. 4, the resin case 7 is sealed with a sealing resin 16 including an insulating resin such as silicone gel or epoxy resin, whereby the semiconductor device according to this preferred embodiment is completed.

More specifically, the method for manufacturing the semiconductor device according to the present invention is characterized by including the steps of (a) preparing the insulating substrate 1 having the circuit pattern 3, (b) bonding the semiconductor elements 5 and 6 on the circuit pattern 3 with the brazing material 13, and (c) bonding the wiring terminal 8 with the brazing material 14 on the electrode provided on the semiconductor elements 5 and 6 on the opposite side of the circuit pattern 3, in which the wiring terminal 8 partially extends to the insulating substrate 1, and in the step (c), the wiring terminal 8 is pressed toward the insulating substrate 1, and the wiring terminal 8 partially comes in contact with the insulating substrate 1 and is insulated from the circuit pattern 3.

As described above, it is important to keep the distance constant between the semiconductor elements 5 and 6, and the wiring terminal 8 in order not to reduce the reliability of the semiconductor device. Since the wiring terminals 8 and 9 are formed by press working in general, it is easy to individually improve dimensional precision (for each of the wiring terminals 8 and 9) (that is, to individually form the wiring terminals 8 and 9 without causing a variation in dimension). However, since the wiring terminals 8 and 9 are held by the resin case 7, the distances between the wiring terminals 8 and 9, and the semiconductor elements 5 and 6 are likely to vary due to warpage or shrinkage of a resin of the resin case 7.

Meanwhile, according to the semiconductor device in this preferred embodiment, the wiring terminal 8 is partially bent toward the insulating substrate 1, and the wiring terminal 8 and the semiconductor elements 5 and 6 come in contact with each other when the wiring terminal 8 is pressed from above toward the insulating substrate 1, so that the wiring terminal 8 can be prevented from separating from the semiconductor elements 5 and 6, and a desirable distance can be provided between the semiconductor elements 5 and 6 and the wiring terminal 8.

As described above, according to this preferred embodiment, the semiconductor elements 5 and 6 can be easily bonded to the wiring terminal 8 within a desirable distance range without the need to strictly control a dimension of the resin case 7 and control precision in assembling the semiconductor device. Therefore, when the precision is improved in the distance between the semiconductor elements 5 and 6, and the wiring terminal 8, a defect rate can be reduced at the time of assembling the semiconductor device (yield is increased in the step of assembling the semiconductor device), and the reliability of the semiconductor device is improved. Furthermore, since the wiring terminal 8 is bonded to the circuit pattern 4 at the two positions, the wiring terminal 8 can be prevented from being inclined, and the precision in the distance can be improved between the semiconductor elements 5 and 6, and the wiring terminal 8.

Figure 5:
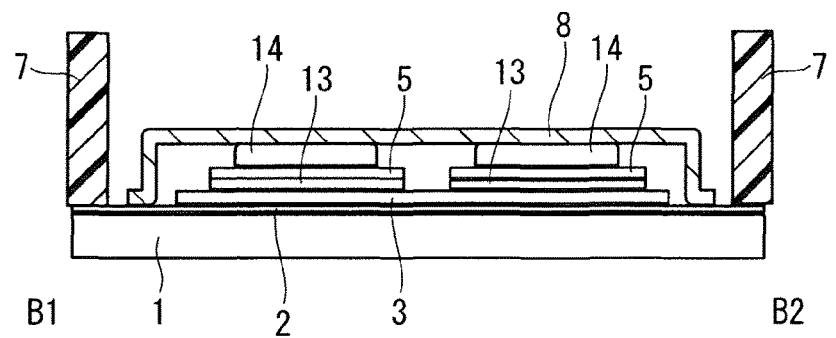
FIG. 5 is a cross-sectional view illustrating another example of FIG. 3.

In addition, while the description has been given to the case where the wiring terminal 8 is partially bonded to the circuit pattern 4 through the brazing material 15 (refer to FIG. 3), the present invention is not limited to this. For example, instead of the circuit pattern 4, a certain projection may be used. Furthermore, as illustrated in FIG. 5, the wiring terminal 8 may be partially in contact with the insulating layer 2 without passing through the circuit pattern 4. In this case, the contact position is to be insulated from the circuit pattern 3.

While the description has been given to the case where the wiring terminal 8 is partially bonded (contacted) to the circuit pattern 4 (or insulating layer 2) at the two positions, the present invention is not limited to this, and they may be bonded at one section to save a space. However, in this case, since the wiring terminal 8 could be warped when the wiring terminal 8 is pressed and bonded (contacted) to the semiconductor elements 5 and 6, the pressed position is desirably near the bonded (contacted) section.

While the description has been given to the case where the metal base substrate is used as the insulating substrate 1, the present invention is not limited to this. For example, instead of the insulating substrate 1, in a case where a substrate to be used has a structure in which a ceramic insulating substrate is bonded to a copper base plate through a brazing material, warpage is generated in a surface of the substrate, so that the present invention is especially effective.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    an insulating substrate having a first circuit pattern;
    a semiconductor element bonded on said first circuit pattern with a first brazing material;
    a resin case; and
    a wiring terminal, integrated with and extending from the resin case, and bonded with a second brazing material on an electrode provided on said semiconductor element on an opposite side of said first circuit pattern, wherein
    a part of said wiring terminal is in contact with said insulating substrate and insulated from said first circuit pattern.

2. The semiconductor device according to claim 1, wherein
    said insulating substrate further has a second circuit pattern separated from said first circuit pattern, and
    said part of said wiring terminal is in contact with said insulating substrate through said second circuit pattern.

3. The semiconductor device according to claim 2, wherein
    said part of said wiring terminal is bonded on said second circuit pattern with a third brazing material.

4. The semiconductor device according to claim 1, wherein
    said part of said wiring terminal is in contact with said insulating substrate at a plurality of positions on opposite sides of said semiconductor element in a planar view.

* * * * *